United States Patent
Mizutani et al.

(10) Patent No.: US 11,497,085 B2
(45) Date of Patent: Nov. 8, 2022

(54) FE—CR ALLOY, METHOD FOR PRODUCING SAME, AND RESISTANCE HEATING ELEMENT

(71) Applicant: JFE STEEL CORPORATION, Tokyo (JP)

(72) Inventors: Akito Mizutani, Tokyo (JP); Tatsuhiko Hiratani, Tokyo (JP); Mitsuyuki Fujisawa, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 16/965,013

(22) PCT Filed: Dec. 5, 2018

(86) PCT No.: PCT/JP2018/044789
§ 371 (c)(1),
(2) Date: Jul. 27, 2020

(87) PCT Pub. No.: WO2019/150762
PCT Pub. Date: Aug. 8, 2019

(65) Prior Publication Data
US 2021/0059019 A1     Feb. 25, 2021

(30) Foreign Application Priority Data
Jan. 30, 2018     (JP) .............................. JP2018-014002

(51) Int. Cl.
*H05B 3/12* (2006.01)
*C22C 38/00* (2006.01)
(Continued)

(52) U.S. Cl.
CPC ............. *H05B 3/12* (2013.01); *C21D 8/0226* (2013.01); *C22C 38/001* (2013.01);
(Continued)

(58) Field of Classification Search
None
See application file for complete search history.

(56) References Cited

U.S. PATENT DOCUMENTS

| 5,427,601 A | 6/1995 | Harada et al. |
| 5,944,917 A | 8/1999 | Takeda et al. |

(Continued)

FOREIGN PATENT DOCUMENTS

| CN | 1732280 A | 2/2006 |
| CN | 102199721 A | 9/2011 |

(Continued)

OTHER PUBLICATIONS

Machine translation from Google patents of CS276019B6 (translated Jun. 23, 2021) (Year: 1992).*

(Continued)

*Primary Examiner* — Elizabeth Collister
(74) *Attorney, Agent, or Firm* — Kenja IP Law PC

(57) ABSTRACT

A Fe—Cr alloy having a chemical composition with increased Si and Al contents, in which the chemical composition satisfies the following formula (1) in terms of the Si content, Al content, and Cr content:

$$14.0 \leq \%\,Si + 1.15 \times \%\,Al + 0.35 \times \%\,Cr \quad (1).$$

26 Claims, 1 Drawing Sheet

(51) Int. Cl.

| | | |
|---|---|---|
| *C22C 38/02* | (2006.01) | |
| *C22C 38/04* | (2006.01) | |
| *C22C 38/06* | (2006.01) | |
| *C22C 38/42* | (2006.01) | |
| *C22C 38/44* | (2006.01) | |
| *C22C 38/46* | (2006.01) | |
| *C22C 38/48* | (2006.01) | |
| *C22C 38/50* | (2006.01) | |
| *C22C 38/54* | (2006.01) | |
| *C21D 8/02* | (2006.01) | |
| *C23C 10/46* | (2006.01) | |

(52) U.S. Cl.
CPC .......... *C22C 38/002* (2013.01); *C22C 38/005* (2013.01); *C22C 38/02* (2013.01); *C22C 38/04* (2013.01); *C22C 38/06* (2013.01); *C22C 38/42* (2013.01); *C22C 38/44* (2013.01); *C22C 38/46* (2013.01); *C22C 38/48* (2013.01); *C22C 38/50* (2013.01); *C22C 38/54* (2013.01); *C23C 10/46* (2013.01); *H05B 2203/013* (2013.01)

(56) References Cited

U.S. PATENT DOCUMENTS

| | | | | |
|---|---|---|---|---|
| 6,364,962 | B1 * | 4/2002 | Takajo | ..................... C21D 8/12 148/112 |
| 6,730,407 | B2 * | 5/2004 | Mori | ...................... B21D 51/18 428/425.8 |
| 7,465,364 | B2 | 12/2008 | Omura et al. | |
| 9,624,563 | B2 | 4/2017 | Mizutani et al. | |
| 9,777,357 | B2 | 10/2017 | Mizutani et al. | |
| 2002/0117239 | A1 * | 8/2002 | Oku | ......................... C22C 38/48 148/607 |
| 2011/0142708 | A1 * | 6/2011 | Didomizio | ............... C22C 38/28 419/19 |
| 2013/0196172 | A1 * | 8/2013 | Mizutani | .................. C22C 38/28 428/606 |
| 2015/0218683 | A1 * | 8/2015 | Nakamura | ............... C22C 38/06 420/38 |

FOREIGN PATENT DOCUMENTS

| | | | | |
|---|---|---|---|---|
| CN | 103459644 | A | 12/2013 | |
| CN | 104870675 | A | 8/2015 | |
| CS | 276019 | B6 * | 3/1992 | |
| EP | 0475420 | A1 | 3/1992 | |
| EP | 0810295 | A1 | 12/1997 | |
| EP | 2778245 | A1 | 9/2014 | |
| GB | 2082631 | A * | 3/1982 | ............ C22C 38/18 |
| JP | S59193247 | A | 11/1984 | |
| JP | H04235255 | A | 8/1992 | |
| JP | H04308004 | A | 10/1992 | |
| JP | H05331552 | A | 12/1993 | |
| JP | H06170498 | A | 6/1994 | |
| JP | H06220587 | A | 8/1994 | |
| JP | H1072645 | A | 3/1998 | |
| JP | H1161348 | A | 3/1999 | |
| JP | 2000273588 | A * | 10/2000 | |
| JP | 2013159837 | A | 8/2013 | |
| JP | 5504778 | B2 | 5/2014 | |
| JP | 2016094662 | A | 5/2016 | |
| JP | 2016204714 | A | 12/2016 | |

OTHER PUBLICATIONS

Machine translation Izumida et al. (JP 2000273588 A) translated by Espacenet Jan. 12, 2022 (Year: 2000).*
Dec. 18, 2020, the Extended European Search Report issued by the European Patent Office in the corresponding European Patent Application No. 18903055.4.
Mar. 31, 2021, Office Action issued by the China National Intellectual Property Administration in the corresponding Chinese Patent Application No. 201880087914.2 with English language search report.
Jul. 9, 2019, Notification of Reasons for Refusal issued by the Japan Patent Office in the corresponding Japanese Patent Application No. 2019-079178 with English language Concise Statement of Relevance.
Mar. 12, 2019, International Search Report issued in the International Patent Application No. PCT/JP2018/044789.
May 6, 2022, Office Action issued by the China National Intellectual Property Administration in the corresponding Chinese Patent Application No. 202110605936.7 with English language search report.
Peizhi, He, Casting Material Chemistry, Jul. 31, 1981, p. 70.

* cited by examiner

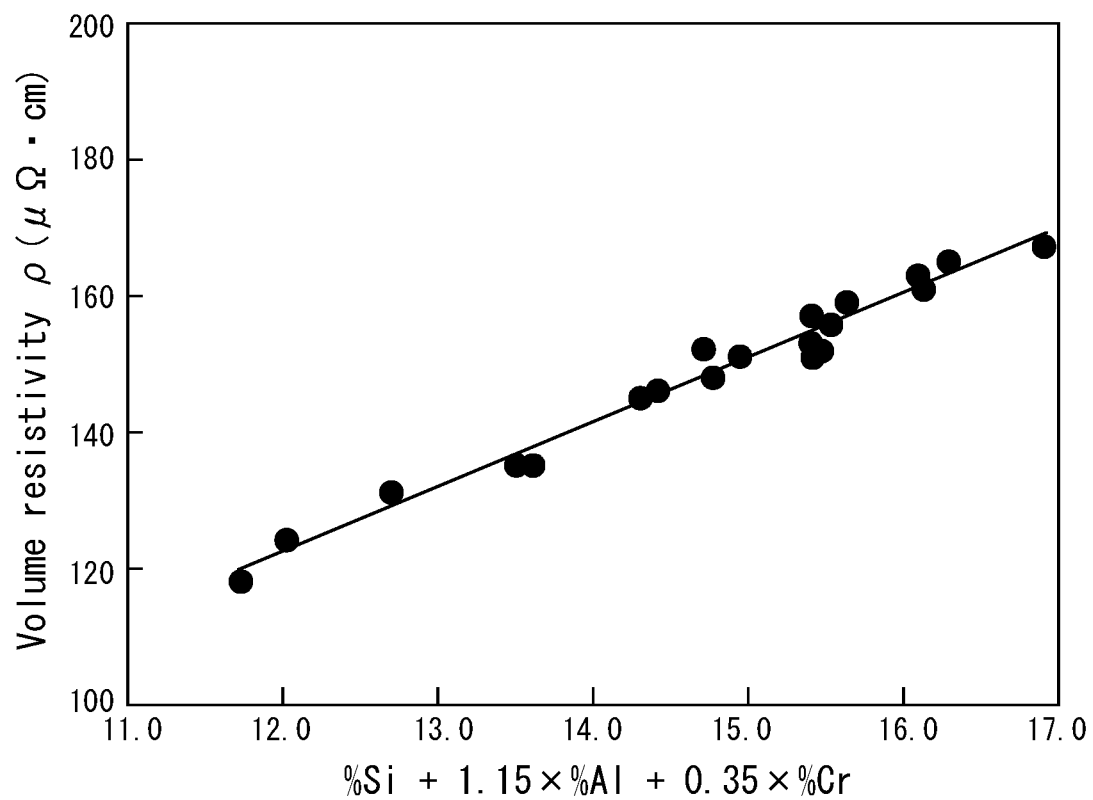

US 11,497,085 B2

FE—CR ALLOY, METHOD FOR PRODUCING SAME, AND RESISTANCE HEATING ELEMENT

TECHNICAL FIELD

This disclosure relates to Fe—Cr alloy excellent in electric resistivity and oxidation resistance.

BACKGROUND

Resistance heating is a method of heating an object by Joule heat generated when a current is applied to a resistance heating element. Since this method has good efficiency of conversion from electric energy to heat energy and uses a simple control apparatus, it is used in a wide range of fields including industrial electric furnaces and electric cooking apparatuses.

Resistance heating elements used in the resistance heating can be classified into metallic heating elements represented by Ni—Cr alloy and Fe—Cr alloy and non-metallic heating elements represented by SiC. The metallic heating elements are superior to the non-metallic heating elements in terms of workability, and thus can be formed into a foil or wire material. Therefore, the metallic heating elements are applicable to thin members such as window glasses and floors, and to members applied with bending loads such as gloves.

As such metallic heating elements, for example, JIS C 2520 specifies three types of Ni—Cr alloy as wires and strips for electrical heating (Type 1 to Type 3 of nickel chromium wires and strips for electrical heating), and two types of Fe—Cr alloy (Type 1 and Type 2 of iron chromium wires and strips for electrical heating). The Ni—Cr alloy is Ni-based alloy having Cr:15% to 21% and Si: 0.75% to 3% as main additive elements. The Fe—Cr alloy is Fe-based alloy having Cr: 17% to 26%, Al: 2% to 6%, Si: 1.5% or less as main additive elements ("%" of each element represents a mass %, hereinafter the same).

Further, JP 2013-159837 A (PTL 1) describes "a stainless steel foil or stainless steel wire material having a volume resistivity with low dependence on a cold rolling reduction ratio, in which the stainless steel foil or stainless steel wire has: a chemical composition containing, in mass %, C: 0.080% or less, Si: 1.5% to 5.0%, Mn: 5% or less, P: 0.050% or less, S: 0.003% or less, Ni: 10% to 15%, Cr: 15% to 22%, Mo: 3% or less, Cu: 3.5% or less, N: 0.2% or less, O: 0.01% or less, and Ti: 0.05% or less, with the balance being Fe and inevitable impurities; an average temperature coefficient of a volume resistivity at 20° C. to 600° C. of 0.00100/° C. or less; and a dependence index of the volume resistivity on a cold rolling reduction ratio defined as $\beta(c)/\beta(A)$ of 0.970 or more and 1.030 or less, where $\beta(c)$ represents a volume resistivity at 200° C. for working materials having a foil rolling ratio or wire area reduction ratio of 50%, and $\beta(A)$ represents a volume resistivity at 200° C. for annealing materials".

Furthermore, JP 2016-094662 A (PTL 2) describes "a stainless steel foil or stainless steel wire material for resistance heating elements having a volume resistivity with low dependence on a cold rolling reduction ratio, in which the stainless steel foil or stainless steel wire has: a chemical composition containing, in mass %, C: 0.080% or less, Si: 1.5% to 5.0%, Mn: 5% or less, P: 0.050% or less, S: 0.003% or less, Ni: 10% to 15%, Cr: 15% to 22%, Mo: 3% or less, Cu: 3.5% or less, N: 0.2% or less, O: 0.01% or less, and Ti: 0.05% or less, with the ratio of Ni/Si being in a range of 3 to 7 and the balance being Fe and inevitable impurities; an average temperature coefficient of a volume resistivity at 20° C. to 600° C. of 0.00100/° C. or less; and a dependence index of the volume resistivity on a cold rolling reduction ratio defined as $\beta(c)/\beta(A)$ of 0.970 or more and 1.030 or less, where $\beta(c)$ represents a volume resistivity at 200° C. for working materials having a foil rolling ratio or wire area reduction ratio of 50%, and $\beta(A)$ represents a volume resistivity at 200° C. for annealing materials".

CITATION LIST

Patent Literature

PTL 1: JP 2013-159837 A
PTL 2: JP 2016-094662 A

SUMMARY

Technical Problem

The electrical resistivity of metallic heating elements is generally lower than that of non-metallic heating elements. Therefore, in order to obtain a required amount of heat generated, it is necessary to reduce the cross-sectional area of a metallic heating element and increase the length of it by processing it into a foil or wire material. However, for the viewpoint of reducing the usage amount of heating elements and improving the flexibility in shape thereof, metallic heating elements having higher electric resistivity have been demanded.

Further, metallic heating elements obtain excellent oxidation resistance through a protective oxide layer formed by Cr and Al in the alloy at high temperature. However, when Cr and Al in the alloy is consumed by long-term use and thus the concentrations of these elements decrease, the protective oxide layer cannot be maintained, causing breakaway oxidation and damage of the heating element.

In particular, heating elements which are installed immediately upstream of exhaust gas purification equipment in automobiles and the like and are used for increasing the temperature of exhaust gas to promote reactions with catalysts are required to have more excellent oxidation resistance because the heating elements may have a maximum arrival temperature exceeding 1000° C.

Among the alloys specified in JIS C 2520, Type 2 and Type 3 of nickel chromium wires and strips for electrical heating of Ni—Cr alloy have a maximum use temperature of 1000° C. and 800° C., respectively, and thus they cannot be used in applications in which the maximum use temperature exceeds 1000° C. Further, although Type 1 of nickel chromium wires and strips for electrical heating has a maximum use temperature of 1100° C., it is very expensive because it contains Ni in an amount of 77% or more. Furthermore, the electrical resistivity is 101 μΩ·cm to 112 μΩ·cm (1.01 μΩ·m to 1.12 μΩ·m) in terms of volume resistivity, which is not enough.

On the other hand, the Fe—Cr alloy has a higher maximum operating temperature than the Ni—Cr alloy, and Type 1 and Type 2 of iron chromium wires and strips for electrical heating have a maximum operating temperature of 1250° C. and 1100° C., respectively. Further, the Fe—Cr alloy has higher electrical resistivity than the Ni—Cr alloy. Type 1 and Type 2 of iron chromium wires and strips for electrical heating have a volume resistivity of 142 μΩ·cm (1.42 μΩ·m) and 123 μΩ·cm (1.23 μΩ·m), respectively.

However, when such Type 1 and Type 2 of iron chromium wires and strip for electrical heating are used at a high temperature above 1000° C. for a long time, the oxidation rate of the heating element is fast and Al is early consumed. This phenomenon is particularly noticeable in foil materials having a thin thickness and wire materials having a small diameter, which results in a significant shortening of life. At high temperatures exceeding 1000° C., a protective oxide layer easily spalls off, which likely causes a damage and rupture of the heating element.

Further, the alloy described in PTLs 1 and 2, which is Fe—Cr alloy, has an austenite microstructure because it contains Ni as an austenite-stabilizing element at a content of 10% to 15% and thus is advantageous in that it has higher strength at high temperatures than Fe—Cr alloy having a ferrite microstructure. However, since the austenite microstructure has a higher thermal expansion coefficient than the ferrite microstructure, a large thermal stress occurs along with volume expansion during heating. In particular, when heating and cooling are repeated under conditions such that the maximum use temperature exceeds 1000° C., deformation and fracture due to the thermal stress easily occur, leading to a shorter life.

It could thus be helpful to provide Fe—Cr alloy which is suitable for using as a resistance heating element, the Fe—Cr alloy having high electric resistivity and excellent in oxidation resistance, in particular oxidation resistance at a high temperature beyond 1000° C., and an advantageous method for producing the same.

Further, it also provides a resistance heating element using the Fe—Cr alloy.

Solution to Problem

In order to solve the above problems, the inventors made various studies, and as a result, discovered the following.
(1) To achieve both excellent electrical resistivity and oxidation resistance at high temperatures in Fe—Cr alloy, it is effective to simultaneously increase the Si content and Al content. In particular, when the Al content exceeds 2.0%, a protective layer of $Al_2O_3$ is formed on the surface in a high temperature environment, which dramatically improves oxidation resistance. Thus, it is possible to improve both electric resistivity and oxidation resistance at high temperatures by simultaneously increasing the Si content and Al content and further containing a certain amount or more of Cr to set the total amount of Si, Al, and Cr to a predetermined amount or more.
(2) However, Al and Si are an element that deteriorates toughness. When the inventors used Fe—Cr alloy containing Cr in the amount of about 20% to produce a material with a changed Si content and Al content, as the Si content and Al content were increased, cracking was likely to occur during hot rolling and cold rolling, and in particular, processing the Fe—Cr alloy into a thin sheet material became difficult.
(3) In order to solve the problems, the inventors made additional studies. As a result, they discovered that in order to simultaneously increase the Si content and Al content of, in particular, a thin Fe—Cr alloy sheet material, it is effective to roll a slab having an increased Al content and a lowered Si content to obtain a sheet material having a final sheet thickness, and subject the sheet material to siliconizing treatment by a thermal CVD method to increase the Si content in the final product. Thus, Fe—Cr alloy having a thin sheet thickness with increased Si and Al contents can be obtained.

This disclosure is based on the discoveries and further studies.

We thus provide:
1. A Fe—Cr alloy having a chemical composition containing (consisting of), by mass %,
  C: 0.020% or less,
  Si: more than 1.5% and 10.0% or less,
  Mn: 1.0% or less,
  P: 0.040% or less,
  S: 0.010% or less,
  Cr: 16.0% to 30.0%,
  Al: 2.0% to 6.5%,
  N: 0.020% or less, and
  Ni: 0.50% or less, with the balance being Fe and inevitable impurities,
the Fe—Cr alloy satisfying the following formula (1):

$$14.0 \leq \% \text{ Si} + 1.15 \times \% \text{ Al} + 0.35 \times \% \text{ Cr} \qquad (1)$$

where % Si, % Al and % Cr indicate a Si content, an Al content, and a Cr content, by mass %, respectively in the chemical composition.

2. The Fe—Cr alloy according to 1., wherein the chemical composition further contains, by mass %, at least one selected from the group consisting of
  Ti: 0.01% to 0.50%,
  Zr: 0.01% to 0.20%,
  Hf: 0.01% to 0.20%,
  REM: 0.01% to 0.20%,
  Cu: 0.01% to 0.10%,
  Nb: 0.01% to 0.50%,
  V: 0.01% to 0.50%,
  Mo: 0.01% to 6.0%,
  W: 0.01% to 6.0%,
  B: 0.0001% to 0.0050%,
  Ca: 0.0002% to 0.0100%, and
  Mg: 0.0002% to 0.0100%.

3. The Fe—Cr alloy according to 1. or 2. having a sheet thickness of 200 μm or less.

4. A method for producing a Fe—Cr alloy, comprising:
  rolling a slab having a chemical composition containing (consisting of), by mass %,
  C: 0.020% or less,
  Si: 0.01% to 1.5%,
  Mn: 1.0% or less,
  P: 0.040% or less,
  S: 0.010% or less,
  Cr: 16.0% to 30.0%,
  Al: 2.0% to 6.5%,
  N: 0.020% or less, and
  Ni: 0.50% or less, with the balance being Fe and inevitable impurities to obtain a sheet material having a final sheet thickness;
  subjecting the sheet material to siliconizing treatment by a thermal CVD method to obtain a Fe—Cr alloy having a Si content of more than 1.5 mass % and 10.0 mass % or less and satisfying the following formula (1):

$$14.0 \leq \% \text{ Si} + 1.15 \times \% \text{ Al} + 0.35 \times \% \text{ Cr} \qquad (1)$$

where % Si, % Al, and % Cr indicate a Si content, an Al content, and a Cr content, by mass %, respectively in the chemical composition of the Fe—Cr alloy.

5. The method for producing a Fe—Cr alloy according to 4., wherein the chemical composition of the slab further contains, by mass %, at least one selected from the group consisting of
  Ti: 0.01% to 0.50%,
  Zr: 0.01% to 0.20%,
  Hf: 0.01% to 0.20%,
  REM: 0.01% to 0.20%, Cu: 0.01% to 0.10%,
Nb: 0.01% to 0.50%,
V: 0.01% to 0.50%,
Mo: 0.01% to 6.0%,
W: 0.01% to 6.0%,
B: 0.0001% to 0.0050%,
Ca: 0.0002% to 0.0100%, and
Mg: 0.0002% to 0.0100%.

6. The method for producing a Fe—Cr alloy according to 4. or 5., wherein the sheet material has a final sheet thickness of 200 μm or less.

7. A resistance heating element made of the Fe—Cr alloy according to any one of 1. to 3.

Advantageous Effect

According to this disclosure, it is possible to obtain a Fe—Cr alloy having high electrical resistivity and excellent in oxidation resistance, in particular, oxidation resistance at a high temperature beyond 1000° C.

Further, since the Fe—Cr alloy of this disclosure is particularly excellent in oxidation resistance at high temperatures, it can be suitable used as heating elements of exhaust gas heating devices which are installed immediately upstream of exhaust gas purification equipment in automobiles and the like, as heating elements of electric furnaces and electric cooking apparatuses, and additionally, as catalyst carriers, reflector plates of heaters, and chimney members.

BRIEF DESCRIPTION OF THE DRAWINGS

In the accompanying drawings:

FIG. 1 is a diagram illustrating the relationship between % Si+1.15×% Al+0.35×% Cr and the electrical resistivity (volume resistivity).

DETAILED DESCRIPTION

This disclosure is described in detail below.

First, the chemical composition of the Fe—Cr alloy of this disclosure are described. Hereinafter, the unit "%" in the chemical composition refers to "mass %" unless specified otherwise.

C: 0.020% or less

When the C content exceeds 0.020%, the manufacture of the Fe—Cr alloy becomes difficult due to deterioration in toughness of hot-rolled steel sheets and cold-rolled steel sheets. Thus, the C content is set to 0.020% or less, preferably 0.015% or less, and more preferably 0.010% or less. No lower limit is particularly placed on the C content, but an excessive decrease in C content results in increased manufacturing costs. Therefore, the C content is preferably 0.002% or more.

Si: more than 1.5% and 10.0% or less

Si has an effect of increasing the electric resistivity of the Fe—Cr alloy. In order to sufficiently obtain the effect of improving the electrical resistivity, the Si content needs to be more than 1.5%. On the other hand, when the Si content exceeds 10.0%, the forming of the Fe—Cr alloy into the shape of a heating element becomes difficult due to significant embrittlement. Therefore, the Si content is set to more than 1.5% and 10.0% or less. The Si content is preferably 1.7% or more, and more preferably 2.0% or more. The Si content is preferably 6.0% or less, more preferably 5.0% or less, and further preferably 4.0% or less.

Mn: 1.0% or less

When the Mn content exceeds 1.0%, the oxidation resistance of steel deteriorates. Therefore, the Mn content is set to 1.0% or less, preferably 0.5% or less, and more preferably 0.15% or less. However, since a Mn content of less than 0.01% makes refining difficult, the Mn content is preferably 0.01% or more.

P: 0.040% or less

When the P content exceeds 0.040%, the manufacture of the Fe—Cr alloy becomes difficult due to deterioration in toughness of steel. Therefore, the P content is set to 0.040% or less, and preferably 0.030% or less. No lower limit is particularly placed on the P content, but an excessive decrease in P content results in increased manufacturing costs. Therefore, the P content is set to preferably 0.005% or more.

S: 0.010% or less

When S content exceeds 0.010%, the manufacture of hot-rolled steel sheets becomes difficult due to deterioration in hot workability. Therefore, the S content is set to 0.010% or less, preferably 0.004% or less, and more preferably 0.002% or less. No lower limit is particularly placed on the S content, but an excessive decrease in S content results in increased manufacturing costs. Therefore, the S content is preferably set to 0.0005% or more.

Cr: 16.0% to 30.0%

Cr is an essential element to ensure oxidation resistance at high temperatures. Further, Cr has an effect of increasing electrical resistivity though the effect is smaller than that of Al and Si. When the Cr content is less than 16.0%, oxidation resistance at high temperatures cannot be sufficiently ensured. On the other hand, when the Cr content exceeds 30.0%, the manufacture of Fe—Cr alloy becomes difficult due to deterioration in the toughness of a slab and a hot-rolled steel sheet in a production process for the Fe—Cr alloy. Therefore, the Cr content is set to 16.0% to 30.0%. The Cr content is preferably 17.0% or more and more preferably 18.0% or more. Further, the Cr content is preferably 26.0% or less and more preferably 22.0 or less.

Al: 2.0% to 6.5%

Al is an element that improves oxidation resistance by forming an oxide layer which has $Al_2O_3$ as a main component (hereinafter, also referred to as $Al_2O_3$ oxide layer) at high temperatures. Further, Al also has an effect of increasing electrical resistivity. These effects are obtained when the Al content is 2.0% or more. On the other hand, when the Al content exceeds 6.5%, the manufacture of Fe—Cr alloy becomes difficult due to deterioration in the toughness of steel. Therefore, the Al content is set to 2.0% to 6.5%. The Al content is preferably 4.0% or more. Further, the Al content is preferably 6.0% or less.

N: 0.020% or less

When the N content exceeds 0.020%, the manufacture of Fe—Cr alloy becomes difficult due to deterioration in the toughness. Therefore, the N content is set to 0.020% or less, and preferably 0.010% or less. No lower limit is particularly placed on the N content, but an excessive decrease in N content results in increased costs. Therefore, the N content is preferably set to 0.002% or more.

Ni: 0.50% or less

Ni is an element that stabilizes the austenite microstructure. Here, when the Ni content exceeds 0.50%, an austenite microstructure is generated when Al is depleted by the progress of oxidation at high temperatures and then Cr starts to oxidize. This changes the thermal expansion coefficient of the Cr—Fe alloy, causing a failure such as a fracture of a member. Therefore, the Ni content is set to 0.50% or less, and preferably 0.20% or less. No lower limit is particularly placed on the Ni content, but excessively reducing the Ni content increases refining cost. Therefore, the Ni content is preferably set to 0.01% or more.

The basic components have been described above. In the Fe—Cr alloy of this disclosure, the Si content, the Al content, and the Cr content need to satisfy the relationship of the following formula (1):

$$14.0 \leq \% \text{ Si} + 1.15 \times \% \text{ Al} + 0.35 \times \% \text{ Cr} \quad (1)$$

where % Si, % Al and % Cr indicate a Si content, an Al content, and a Cr content, by mass %, respectively in the chemical composition of the Fe—Cr alloy.

That is, in order to improve the electric resistivity of the Fe—Cr alloy, it is effective to simultaneously increase the Si content and Al content. Further, although inferior to Si and Al, Cr also has an effect of improving the electric resistivity of the Fe—Cr alloy. Thus, the electric resistivity of the Fe—Cr alloy varies depending on the total content of the Si content, Al content and Cr content.

The inventors produced Fe—Cr alloys while changing the contents of Si, Al, and Cr under various conditions and measured the electrical resistivity in terms of volume resistivity. As a result, they discovered that as illustrated in FIG. 1, the volume resistivity of the Fe—Cr alloy is nearly proportional to % Si+1.15×% Al+0.35×% Cr.

Further, it can be seen from FIG. 1 that when the value of % Si+1.15×% Al+0.35×% Cr is 14.0 or more, more excellent volume resistivity (more than 142 μΩ·cm) than that of Type 1 of iron chromium wires and strip for electrical heating specified in JIS C 2520 can be obtained.

Therefore, the value of % Si+1.15×% Al+0.35×% Cr is set to 14.0 or more, preferably 14.5 or more, and more preferably 15.0 or more. No upper limit is particularly placed thereon, yet the upper limit is preferably set to about 18.0.

FIG. 1 plots the data of Nos. 1 to 10 and Nos. 12 to 21 in Table 2 and Table 3 in the example described below.

In addition to the above basic components, the following elements can be further contained.

Ti: 0.01% to 0.50%

Since Ti has an effect of improving toughness and oxidation resistance by combining with C and N in steel, the Ti content can be set to 0.01% or more as required. However, when the Ti content exceeds 0.50%, oxidation resistance at high temperatures decreases because a large amount of Ti oxides are incorporated into an Al$_2$O$_3$ layer. Therefore, when Ti is contained, the content is set to 0.01% to 0.50%. The Ti content is more preferably 0.05% or more. Further, the Ti content is more preferably 0.20% or less.

Zr: 0.01% to 0.20%

Zr has an effect of improving the adhesion of an Al$_2$O$_3$ oxide layer and reducing the growth rate thereof which improves oxidation resistance. Therefore, it is preferable to contain Zr when particularly excellent oxidation resistance is required. Further, Zr improves toughness by stabilizing C and N. These effects are obtained when the Zr content is 0.01% or more. However, when the Zr content exceeds 0.20%, Zr forms an intermetallic compound with Fe and the like, deteriorating the toughness of the Fe—Cr alloy. Therefore, when Zr is contained, the content is set to 0.01% to 0.20%. The Zr content is more preferably 0.02% or more. Further, the Zr content is more preferably 0.10% or less.

Hf: 0.01% to 0.20%

Hf has an effect of improving the adhesion of an Al$_2$O$_3$ oxide layer and reducing the growth rate thereof which improves oxidation resistance. Therefore, it is preferable to contain Hf when particularly excellent oxidation resistance is required. The effect is obtained when the Hf content is 0.01% or more. However, when the Hf content exceeds 0.20%, Hf forms an intermetallic compound with Fe and the like, deteriorating toughness. Therefore, when Hf is contained, the content is set to 0.01% to 0.20%. The Hf content is more preferably 0.02% or more. Further, the Hf content is more preferably 0.10% or less.

When Zr and Hf are simultaneously contained, from the viewpoint of ensuring toughness, the total content of Zr and Hf is preferably set to 0.20% or less.

REM: 0.01% to 0.20%

REM refers to Sc, Y and lanthanoid elements (elements of atomic numbers 57 to 71 such as La, Ce, Pr, Nd, and Sm). REM has an effect of improving the adhesion of an Al$_2$O$_3$ oxide layer and improving the spalling resistance of the Al$_2$O$_3$ oxide layer under environments in which oxidation is repeated. Therefore, it is preferable to contain REM when particularly excellent oxidation resistance is required. The effect is obtained when the REM content (the total content of Sc, Y, and lanthanide elements described above) is 0.01% or more. On the other hand, when the REM content exceeds 0.20%, the manufacture of hot-rolled steel sheets becomes difficult due to deterioration in the hot workability. Therefore, when REM is contained, the content is set to 0.01% to 0.20%. The REM content is preferably 0.03% or more. The REM content is more preferably 0.10% or less.

In adding REM, to reduce cost, metal in which REM are not separated or refined (for example, misch metal) may be used.

Cu: 0.01% to 0.10%

Since Cu has an effect of improving high-temperature strength through precipitation in steel, the Cu content can be set to 0.01% or more as required. However, a Cu content exceeding 0.10% deteriorates the toughness of steel. Therefore, when Cu is contained, the content is set to 0.01% to 0.10%. The Cu content is more preferably 0.05% or less and further preferably 0.03% or less.

Nb: 0.01% to 0.50%

Since Nb has an effect of improving toughness and oxidation resistance by combining with C and N in steel, the Nb content can be set to 0.01% or more as required. However, when the Nb content exceeds 0.50%, the oxidation resistance at high temperatures deteriorates because a large amount of Nb oxides are incorporated into an Al$_2$O$_3$ layer. Therefore, when Nb is contained, the content is set to 0.01% to 0.50%. The Nb content is more preferably 0.05% or more. Further, the Nb content is more preferably 0.20% or less.

V: 0.01% to 0.50%

Since V has an effect of improving toughness and oxidation resistance by combining with C and N in steel, the V content can be set to 0.01% or more as required. However, when the V content exceeds 0.50%, oxidation resistance at high temperatures deteriorates because a large amount of V oxides are incorporated into an Al$_2$O$_3$ layer. Therefore, when V is contained, the content is set to 0.01% to 0.50%. The V content is more preferably 0.05% or more. Further, the V content is more preferably 0.20% or less.

Mo: 0.01% to 6.0%

Mo increases strength at high temperatures. When the Fe—Cr alloy is used as a heating element, Mo contributes to extended service life of the heating element. This effect is obtained when the Mo content is 0.01% or more. On the other hand, when the Mo content exceeds 6.0%, the manufacture of the Fe—Cr alloy becomes difficult due to deterioration in the workability. Therefore, when Mo is contained, the content is set to 0.01% to 6.0%. The Mo content is more preferably 1.0% or more. Further, the Mo content is more preferably 5.0% or less.

W: 0.01% to 6.0%

W increases strength at high temperatures. When the Fe—Cr alloy is used as a heating element, W contributes to extended service life of the heating element. This effect is obtained when the W content is 0.01% or more. On the other hand, when the W content exceeds 6.0%, the manufacture of the Fe—Cr alloy becomes difficult due to deterioration in the workability. Therefore, when W is contained, the content is set to 0.01% to 6.0%. The W content is more preferably 1.0% or more. Further, the W content is more preferably 5.0% or less.

When both Mo and W are contained, it is preferable that the total content of Mo and W is set to 6.0% or less in order to prevent a reduction in workability.

B: 0.0001% to 0.0050%

B has an effect of preventing cracking during hot rolling by strengthening grain boundaries of steel. This effect is obtained when the B content is 0.0001% or more. On the other hand, a B content exceeding 0.0050% may deteriorate oxidation resistance. Therefore, when B is contained, the content is set to 0.0001% to 0.0050%. The B content is more preferably 0.0010% or more. Further, the B content is more preferably 0.0040% or less.

Ca: 0.0002% to 0.0100%, Mg: 0.0002% to 0.0100%

An appropriate amount of Ca or Mg has an effect of improving the adhesion of an $Al_2O_3$ oxide layer to steel and reducing the growth rate thereof which improves oxidation resistance. This effect is obtained when the Ca content is 0.0002% or more and the Mg content is 0.0002% or more. More preferably, the Ca content is 0.0005% or more and the Mg content is 0.0015% or more. Further preferably, the Ca content is 0.0010% or more. However, if these elements are excessively contained, toughness and oxidation resistance may be deteriorated. Therefore, when Ca and Mg are contained, the Ca content and the Mg content are both set to 0.0100% or less, and more preferably 0.0050% or less.

Components other than the above are Fe and inevitable impurities.

That is, the Fe—Cr alloy of this disclosure has a chemical composition containing, by mass %,
C: 0.020% or less, Si: more than 1.5% and 10.0% or less, Mn: 1.0% or less, P: 0.040% or less, S: 0.010% or less, Cr: 16.0% to 30.0%, Al: 2.0% to 6.5%, N: 0.020% or less, and Ni: 0.50% or less,
and further containing, optionally, at least one selected from the group consisting of Ti: 0.01% to 0.50%, Zr: 0.01% to 0.20%, Hf: 0.01% to 0.20%, REM: 0.01% to 0.20%, Cu: 0.01% to 0.10%, Nb: 0.01% to 0.50%, V: 0.01% to 0.50%, Mo: 0.01% to 6.0%, W: 0.01% to 6.0%, B: 0.0001% to 0.0050%, Ca: 0.0002% to 0.0100%, and Mg: 0.0002% to 0.0100%,
with the balance being Fe and inevitable impurities, the Fe—Cr alloy satisfying the above formula (1).

Further, although the thickness of the Fe—Cr alloy of this disclosure is not particularly limited, when the Fe—Cr alloy is used for heating elements of electric cooking apparatuses, exhaust gas heating devices installed immediately upstream of exhaust gas purification equipment, and the like, the sheet thickness of the Fe—Cr alloy is preferably set to 200 μm or less in order to reduce the sectional area and increase the surface area. The lower limit of the sheet thickness is preferably set to 20 μm in order to secure strength.

Next, a preferable method for producing the Fe—Cr alloy of this disclosure will be described below.

In this method, molten steel is prepared by steelmaking according to a publicly known method such as a method using a converter, an electric heating furnace, or a vacuum melting furnace and subjected to continuous casting or ingot casting and blooming to obtain a slab, the molten steel having a chemical composition containing, by mass %,
C: 0.020% or less, Si: 0.01% to 1.5%, Mn: 1.0% or less, P: 0.040% or less, S: 0.010% or less, Cr: 16.0% to 30.0%, Al: 2.0% to 6.5%, N: 0.020% or less and Ni: 0.50% or less,
and further containing, optionally, at least one selected from the group consisting of Ti: 0.01% to 0.50%, Zr: 0.01% to 0.20%, Hf: 0.01% to 0.20%, REM: 0.01% to 0.20%, Cu: 0.01% to 0.10%, Nb: 0.01% to 0.50%, V: 0.01% to 0.50%, Mo: 0.01% to 6.0%, W: 0.01% to 6.0%, B: 0.0001% to 0.0050%, Ca: 0.0002% to 0.0100%, and Mg: 0.0002% to 0.0100%, with the balance being Fe and inevitable impurities.

The chemical composition of the slab (and sheet material used as a material subjected to siliconizing treatment described below) will be described.

Si: 0.01% to 1.5%

The Si content of the slab (and sheet material used as a material subjected to siliconizing treatment) is set to 1.5% or less. When the Si content exceeds 1.5%, the manufacture of a sheet material (foil material) particularly with a sheet thickness of 200 μm or less becomes difficult due to occurrence of fracture during hot rolling or cold rolling caused by deterioration in the toughness. Therefore, the Si content of the slab is set to 1.5% or less, preferably 1.0% or less, and more preferably 0.5% or less. On the other hand, a Si content of the slab of less than 0.01% deteriorates oxidation resistance. Therefore, the Si content is set to 0.01% or more, and preferably 0.05% or more.

The chemical composition of elements other than Si in the slab may be the same as the chemical composition of the Fe—Cr alloy described above.

However, in the siliconizing treatment by a thermal CVD method described below, although Fe is basically substituted by Si, elements other than Fe, for example, Al and Cr may also form chlorides and be substituted by Si, resulting in the reduction in the Al and Cr contents compared with those in the slab. In particular, since Al and Cr plays a particularly important role in improving oxidation resistance, the Cr content and Al content after siliconizing treatment should not be less than the above-mentioned chemical composition of the Fe—Cr alloy. From such a viewpoint, the Cr content of the slab (and sheet material used as a material subjected to siliconizing treatment) is preferably set to 18.0% to 30.0%, and the Al content is preferably set to 3.0% to 6.5%. The Cr content is more preferably 19.0% or more. Further, the Cr content is more preferably 22.0% or less. The Al content is more preferably 4.5% or more. Further, the Al content is more preferably 6.0% or less.

The slab is then rolled to form a sheet material having a final sheet thickness. The rolling method is not particularly limited and conventional methods can be used. For example, the slab is hot rolled to obtain a hot-rolled steel sheet and the hot-rolled steel sheet is subjected to cold rolling and annealing to obtain a sheet material (material subjected to siliconizing treatment) having a final sheet thickness or the slab is subjected to hot rolled to obtain a hot-rolled steel sheet, and the hot-rolled steel sheet is subjected to hot-rolled sheet annealing and then cold rolling to obtain a sheet material (material subjected to siliconizing treatment) having a final sheet thickness.

Further, conditions of the hot rolling, hot-rolled sheet annealing, cold rolling, and annealing are not particularly limited, and conventional methods can be used. For example, the slab is heated at 1100° C. to 1250° C. for 1 hour to 24 hours, and then hot rolled to obtain a hot-rolled steel sheet having a sheet thickness of about 2.0 mm to 6.0 mm. Subsequently, the hot-rolled steel sheet is subjected to descaling by pickling and mechanical polishing as required and then to cold rolling and annealing to obtain a cold-rolled sheet having a final sheet thickness.

In order to obtain a sheet material having a desired final sheet thickness, the cold rolling and annealing (cold-rolled sheet annealing) may be repeated, yet from a viewpoint of production efficiency, a smaller number of the cold rolling and annealing is preferable. As used herein, the sheet material includes so-called foil materials (for example, having a sheet thickness of 20 μm to 200 μm).

The sheet material having a final sheet thickness thus obtained is subjected to siliconizing treatment by a thermal CVD method.

The siliconizing treatment by a thermal CVD method is a method in which $SiCl_4$ gas with a high temperature is blown to the sheet material having a final sheet thickness to increase the Si content. For example, as described in JPH06-45881B2, the siliconizing treatment is sometimes used as a technique for producing silicon steel (electrical steel sheet).

Specifically, a sheet material used as a material subjected to siliconizing treatment is heated to a temperature range of 700° C. or higher and 1400° C. or lower in a heat-treatment furnace under a non-oxidizing atmosphere. Then, $SiCl_4$ gas is introduced into the furnace. As a result, on the surface of the sheet material subjected to siliconizing treatment, $Fe_3Si$ is generated by the following reaction, resulting in the formation of a concentrated Si layer.

$$SiCl_4 + 5Fe \rightarrow Fe_3Si + 2FeCl_2$$

This reaction substitutes Fe in the material with Si, increasing the Si content of the sheet material. After the treatment, in order to diffuse Si concentrated in the surface layer for homogenization, heat treatment in which the sheet material is held in a temperature range of 900° C. or higher and 1300° C. or lower for 1 minute or more may be carried out.

Thus, it is possible to stably produce Fe—Cr alloy having both a high Si content and Al content by subjecting a sheet material used as a material subjected to siliconizing treatment, the sheet material having a Si content of 0.01% to 1.5% and an Al content of 2.0% to 6.5%, to siliconizing treatment by a thermal CVD method.

The Si content in the Fe—Cr alloy obtained after the siliconizing treatment (Si increase in the siliconizing treatment) can be controlled by adjusting treatment temperature and treatment time (in a range of 20 seconds to 600 seconds) and/or $SiCl_4$ gas concentration (in a range of 5 vol % to 40 vol % with the balance being Ar gas) in the siliconizing treatment.

EXAMPLES

Slabs having the chemical compositions listed in Table 1 (with the balance being Fe and inevitable impurities) which were prepared by steelmaking in a 50 kg small vacuum melting furnace were heated to 1200° C. and then hot-rolled in a temperature range of 900° C. to 1200° C. to obtain hot rolled steel sheets having a sheet thickness of 3.0 mm. Since a cold-rolled steel sheet could not be made from the steel sample ID: J in Table 1 due to cracking occurring during hot rolling, siliconizing treatment could not be performed and subsequent evaluations could not be carried out. Then, the resulting hot-rolled steel sheets were subjected to hot-rolled sheet annealing at 900° C. for 1 minute in air, and cold rolled to a sheet thickness of 1.0 mm after the surface scale was removed by pickling to obtain cold-rolled steel sheets. Since a foil material could not be made from the steel sample ID: K in Table 1 due to cracking occurring during cold rolling, siliconizing treatment could not be performed and subsequent evaluations could not be carried out. The cold-rolled steel sheets were subjected to cold-rolled sheet annealing at 900° C. for 1 minute in air, and then further cold rolled after the surface scale was removed by pickling to obtain sheet materials (foil materials) having a sheet thickness of 40 μm to 110 μm.

Then, the resulting sheet materials were subjected to siliconizing treatment. The siliconizing treatment was performed in a small batch-type heating furnace. Specifically, a sheet having a width of 50 mm and a length of 150 mm was collected from each sheet material and heated to 950° C. to 1100° C. in Ar atmosphere. Then, mixed gas containing 15 vol % $SiCl_4$ gas with the balance being Ar gas was introduced into the heating furnace. The treatment time was from 25 seconds to 450 seconds.

Thereafter, the sheet was further held in vacuum at 1150° C. for 30 minutes and subjected to a heat treatment of furnace cooling to produce a Fe—Cr alloy.

The chemical composition of the Fe—Cr alloy thus obtained was measured by collecting chips from a portion of the Fe—Cr alloy and analyzing the chips through wet analysis. The measurement results are listed in Table 2. The balance was Fe and inevitable impurities.

Further, using the Fe—Cr alloy, (1) workability, (2) electric resistivity, and (3) oxidation resistance were evaluated in the following manner. The evaluation results are listed in Table 3.

(1) Workability

Workability was evaluated by subjecting the obtained Fe—Cr alloy to corrugation work commonly performed in heating elements for metal used in exhaust gas purification equipment of automobiles and the like. That is, the Fe—Cr alloy was subjected to corrugation work by passing the Fe—Cr alloy between two gear-shaped rollers having a maximum bending radius of 0.5 mm, a corrugation pitch of 2.0 mm, and a corrugation height of 2.0 mm. Then, when the Fe—Cr alloy had no fracture or crack, it was evaluated as good, and when the Fe—Cr-alloy had any fracture or crack, it was evaluated as poor.

(2) Electrical Resistivity

The electric resistivity was measured with reference to the four-probe method specified in JIS K 7194. A device manufactured by Mitsubishi Chemical Corporation: MCP-T600 was used. That is, five test pieces having a size of 50 mm×80 mm were cut out from the Fe—Cr alloy, and the resistance was measured at one point in the center part of each test piece to calculate the volume resistivity. Then, an average value for the five test pieces was taken to be the volume resistivity of the Fe—Cr alloy and evaluated by the following criteria.

Excellent (pass): the volume resistivity is more than 150 μΩ·cm.

Good (pass): the volume resistivity is more than 142 μΩ·cm and 150 μΩ·cm or less.

Poor (fail): the volume resistivity is 142 μΩ·cm or less.

(3) Oxidation Resistance

The oxidation resistance was evaluated by the oxidation test in which the Fe—Cr alloy was held in high-temperature air. That is, two test pieces having a size of a width of 20 mm×a length of 30 mm was collected from the Fe—Cr alloy and oxidized in an air atmosphere at 1100° C. for 400 hours. Then, the mass gain before and after the oxidation treatment (a value obtained by dividing the mass change of each of the test pieces before and after the oxidation treatment by the surface area of the test piece before the oxidation treatment) was measured. Then, an average value of the mass gain for the two test pieces was taken to be the mass gain of the Fe—Cr alloy and evaluated by the following criteria.

Excellent (pass): the mass gain by oxidation is 10.0 g/m² or less.

Good (pass): the mass gain by oxidation is more than 10.0 g/m² and 15.0 g/m or less.

Poor (fail): the mass gain by oxidation is more than 15.0 g/m².

TABLE 1

| Steel sample ID of raw material subjected to siliconizing treatment | Chemical composition of slab (mass %) | | | | | | | | | | Remarks |
|---|---|---|---|---|---|---|---|---|---|---|---|
| | C | Si | Mn | P | S | Cr | Al | N | Ni | Others | |
| A | 0.006 | 0.16 | 0.11 | 0.024 | 0.001 | 20.1 | 5.8 | 0.005 | 0.16 | — | Conforming steel |
| B | 0.005 | 0.13 | 0.11 | 0.024 | 0.001 | 20.1 | 5.8 | 0.005 | 0.16 | Zr: 0.030, La: 0.091 | Conforming steel |
| C | 0.008 | 0.85 | 0.13 | 0.024 | 0.002 | 17.5 | 3.5 | 0.011 | 0.21 | Hf: 0.10, La: 0.033, Ce: 0.056 | Conforming steel |
| D | 0.012 | 1.4 | 0.12 | 0.026 | 0.002 | 20.5 | 6.2 | 0.007 | 0.15 | Ti: 0.25, Cu: 0.05 | Conforming steel |
| E | 0.015 | 0.15 | 0.17 | 0.025 | 0.001 | 29.1 | 2.5 | 0.008 | 0.18 | La: 0.082, V: 0.11, B: 0.0032 | Conforming steel |
| F | 0.008 | 0.23 | 0.51 | 0.023 | 0.001 | 20.0 | 5.6 | 0.008 | 0.16 | Zr: 0.041, La: 0.083, Mo: 3.1, Ca: 0.0019, Mg: 0.0015 | Conforming steel |
| G | 0.008 | 0.13 | 0.15 | 0.024 | 0.002 | 20.3 | 5.5 | 0.006 | 0.43 | Hf: 0.062, Ce: 0.056, W: 2.5, Nb: 0.20 | Conforming steel |
| H | 0.006 | 0.15 | 0.15 | 0.026 | 0.001 | 20.0 | 3.0 | 0.005 | 0.16 | — | Conforming steel |
| I | 0.006 | 0.20 | 0.15 | 0.025 | 0.001 | 26.1 | 3.0 | 0.006 | 0.16 | — | Conforming steel |
| J | 0.005 | 0.16 | 0.11 | 0.025 | 0.001 | 20.2 | 7.5 | 0.005 | 0.15 | — | Comparative steel |
| K | 0.006 | 1.8 | 0.13 | 0.024 | 0.001 | 20.1 | 5.8 | 0.005 | 0.16 | — | Comparative steel |

TABLE 2

| No. | Steel sample ID of raw material subjected to siliconizing treatment | Sheet thickness (μm) | Siliconizing treatment conditions | | Chemical composition of Fe—Cr alloy (mass %) | | | | |
|---|---|---|---|---|---|---|---|---|---|
| | | | Treatment temperature (°C.) | Treatment time (sec.) | C | Si | Mn | P | S |
| 1 | A | 50 | 1100 | 20 | 0.004 | 2.1 | 0.09 | 0.024 | 0.001 |
| 2 | A | 50 | 1100 | 40 | 0.003 | 4.3 | 0.08 | 0.023 | 0.001 |
| 3 | B | 50 | 950 | 300 | 0.004 | 1.6 | 0.10 | 0.022 | 0.001 |
| 4 | B | 50 | 950 | 450 | 0.002 | 2.9 | 0.09 | 0.022 | 0.001 |
| 5 | B | 50 | 1025 | 60 | 0.004 | 0.3 | 0.11 | 0.024 | 0.001 |
| 6 | B | 50 | 1025 | 120 | 0.004 | 1.7 | 0.10 | 0.022 | 0.001 |
| 7 | B | 50 | 1025 | 180 | 0.003 | 3.2 | 0.09 | 0.024 | 0.001 |
| 8 | B | 50 | 1025 | 220 | 0.002 | 4.2 | 0.08 | 0.024 | 0.001 |
| 9 | B | 50 | 1100 | 25 | 0.002 | 2.9 | 0.09 | 0.023 | 0.001 |
| 10 | B | 50 | 1100 | 60 | 0.003 | 5.5 | 0.07 | 0.024 | 0.001 |
| 11 | B | 50 | 1100 | 120 | 0.002 | 11.8 | 0.03 | 0.024 | 0.001 |
| 12 | C | 50 | 1100 | 15 | 0.008 | 2.1 | 0.12 | 0.024 | 0.002 |
| 13 | C | 50 | 1100 | 30 | 0.006 | 4.1 | 0.10 | 0.023 | 0.001 |
| 14 | D | 40 | 1100 | 30 | 0.009 | 3.8 | 0.09 | 0.025 | 0.002 |
| 15 | E | 50 | 1100 | 20 | 0.014 | 2.1 | 0.16 | 0.025 | 0.001 |
| 16 | E | 50 | 1100 | 40 | 0.012 | 4.5 | 0.12 | 0.024 | 0.001 |
| 17 | F | 80 | 1100 | 40 | 0.006 | 4.2 | 0.45 | 0.023 | 0.001 |
| 18 | G | 110 | 1100 | 50 | 0.006 | 3.9 | 0.11 | 0.025 | 0.002 |
| 19 | H | 50 | 1100 | 40 | 0.003 | 4.3 | 0.11 | 0.026 | 0.001 |
| 20 | I | 50 | 1025 | 160 | 0.004 | 2.0 | 0.13 | 0.025 | 0.001 |
| 21 | I | 50 | 1025 | 200 | 0.004 | 3.1 | 0.12 | 0.024 | 0.001 |
| 22 | J | Siliconizing treatment could not be performed due to cracking occuring during hot rolling | | | | | | | |
| 23 | K | Siliconizing treatment could not be performed due to cracking occuring during cold rolling | | | | | | | |

| No. | Chemical composition of Fe—Cr alloy (mass %) | | | | | % Si + 1.15 × % Al + 0.35 × % Cr | Remarks |
|---|---|---|---|---|---|---|---|
| | Cr | Al | N | Ni | Others | | |
| 1 | 19.3 | 5.3 | 0.005 | 0.15 | — | 15.0 | Example |
| 2 | 18.3 | 4.7 | 0.004 | 0.16 | — | 16.1 | Example |
| 3 | 19.9 | 5.4 | 0.005 | 0.16 | Zr: 0.027, La: 0.082 | 14.8 | Example |
| 4 | 19.0 | 5.1 | 0.004 | 0.16 | Zr: 0.025, La: 0.074 | 15.4 | Example |
| 5 | 20.0 | 5.4 | 0.005 | 0.16 | Zr: 0.029, La: 0.073 | 13.5 | Comparative example |
| 6 | 19.4 | 5.4 | 0.005 | 0.16 | Zr: 0.026, La: 0.072 | 14.7 | Example |
| 7 | 18.8 | 5.0 | 0.005 | 0.16 | Zr: 0.024, La: 0.072 | 15.5 | Example |
| 8 | 18.3 | 4.8 | 0.004 | 0.16 | Zr: 0.022, La: 0.067 | 16.1 | Example |
| 9 | 19.0 | 5.1 | 0.005 | 0.16 | Zr: 0.025, La: 0.074 | 15.4 | Example |
| 10 | 17.8 | 4.5 | 0.004 | 0.16 | Zr: 0.020, La: 0.060 | 16.9 | Example |

TABLE 2-continued

| | | | | | | | |
|---|---|---|---|---|---|---|---|
| 11 | 15.2 | 2.9 | 0.005 | 0.16 | Zr: 0.016, La: 0.048 | 20.4 | Comparative example |
| 12 | 17.0 | 3.2 | 0.011 | 0.02 | Hf: 0.092, La: 0.030, Ce: 0.051 | 11.7 | Comparative example |
| 13 | 15.7 | 2.1 | 0.010 | 0.19 | Hf: 0.083, La: 0.025, Ce: 0.042 | 12.0 | Comparative example |
| 14 | 18.9 | 5.1 | 0.007 | 0.15 | Ti: 0.19, Cu: 0.04 | 16.3 | Example |
| 15 | 28.3 | 2.1 | 0.008 | 0.18 | La: 0.078, V: 0.09, B: 0.0030 | 14.4 | Example |
| 16 | 27.2 | 1.2 | 0.007 | 0.18 | La: 0.059, V: 0.08, B: 0.0025 | 15.4 | Comparative example |
| 17 | 18.2 | 4.4 | 0.006 | 0.16 | Zr: 0.030, La: 0.062, Mo: 3.0 Ca: 0.0010, Mg: 0.0011 | 15.6 | Example |
| 18 | 18.6 | 4.4 | 0.005 | 0.38 | Hf: 0.058, Ce: 0.042, W: 2.3, Nb: 0.19 | 15.5 | Example |
| 19 | 18.2 | 1.8 | 0.005 | 0.16 | — | 12.7 | Comparative example |
| 20 | 25.0 | 2.5 | 0.004 | 0.15 | — | 13.6 | Comparative example |
| 21 | 24.8 | 2.2 | 0.004 | 0.15 | — | 14.3 | Example |
| 22 | | | | | Siliconizing treatment could not be performed due to cracking occuring during hot rolling | | Comparative example |
| 23 | | | | | Siliconizing treatment could not be performed due to cracking occuring during cold rolling | | Comparative example |

TABLE 3

| No. | Steel sample ID of raw material subjected to siliconizing treatment | (1) Workability | (2) Electric resistivity Volume resistivity ($\mu\Omega \cdot cm$) | Evaluation | (3) Oxidation resistance Mass gain by oxidation ($g/m^2$) | Evaluation | Remarks |
|---|---|---|---|---|---|---|---|
| 1 | A | good | 151 | excellent | 11 | good | Example |
| 2 | A | good | 163 | excellent | 12 | good | Example |
| 3 | B | good | 148 | good | 7.9 | excellent | Example |
| 4 | B | good | 151 | excellent | 7.6 | excellent | Example |
| 5 | B | good | 135 | poor | 7.1 | excellent | Comparative example |
| 6 | B | good | 152 | excellent | 7.9 | excellent | Example |
| 7 | B | good | 156 | excellent | 7.8 | excellent | Example |
| 8 | B | good | 161 | excellent | 9.4 | excellent | Example |
| 9 | B | good | 153 | excellent | 8.2 | excellent | Example |
| 10 | B | good | 167 | excellent | 9.3 | excellent | Example |
| 11 | B | poor | unmeasurable | — | unmeasurable | — | Comparative example |
| 12 | C | good | 118 | poor | 11 | good | Comparative example |
| 13 | C | good | 124 | poor | 13 | good | Comparative example |
| 14 | D | good | 165 | excellent | 8.1 | excellent | Example |
| 15 | E | good | 146 | good | 13 | good | Example |
| 16 | E | good | 157 | excellent | 28 | poor | Comparative example |
| 17 | F | good | 159 | excellent | 7.9 | excellent | Example |
| 18 | G | good | 152 | excellent | 7.6 | excellent | Example |
| 19 | H | good | 131 | poor | 35 | poor | Comparative example |
| 20 | I | good | 135 | poor | 13 | good | Comparative example |
| 21 | I | good | 145 | good | 14 | good | Example |
| 22 | J | Siliconizing treatment could not be performed due to cracking occuring during hot rolling | | | | | Comparative example |
| 23 | K | Siliconizing treatment could not be performed due to cracking occuring during cold rolling | | | | | Comparative example |

It can be seen from Table 3 that the examples had high workability and electric resistivity, and further excellent oxidation resistance.

On the other hand, in the comparative examples, a test piece could not be made due to cracking occurring during hot rolling or cold rolling, or at least one of workability, electric resistivity, or oxidation resistance was not enough.

No. 11 was very brittle because it had an excessively high Si content, and thus it was not possible to cut out a test piece therefrom having a predetermined shape to be used for the evaluation of (2) electric resistivity and (3) oxidation resistance. Therefore, No. 11 was not evaluated in terms of (2) electric resistivity and (3) oxidation resistance.

The invention claimed is:
1. A Fe—Cr alloy having a chemical composition consisting of, by mass %,

C: 0.020% or less,
Si: 3.1% to 10.0%,
Mn: 1.0% or less,
P: 0.040% or less,
S: 0.010% or less,
Cr: 16.0% to 30.0%,
Al: 2.0% to 6.5%,
N: 0.020% or less,
Ni: 0.50% or less, and
Ca: 0.0002% to 0.0100%, with the balance being Fe and inevitable impurities, the Fe—Cr alloy satisfying the following formula (1):

$$14.0 \leq \% \text{Si} + 1.15 \times \% \text{Al} + 0.35 \times \% \text{Cr} \quad (1)$$

where % Si, % Al and % Cr indicate a Si content, an Al content, and a Cr content, by mass %, respectively in the chemical composition.

2. The Fe—Cr alloy according to claim 1 having a sheet thickness of 200 μm or less.

3. A resistance heating element made of the Fe—Cr alloy according to claim 2.

4. A resistance heating element made of the Fe—Cr alloy according to claim 1.

5. The Fe—Cr alloy according to claim 1, wherein the Al content of the chemical composition is 5.3% to 6.5%.

6. A Fe—Cr alloy having a chemical composition consisting of, by mass %,
C: 0.020% or less,
Si: 3.1% to 10.0%,
Mn: 1.0% or less,
P: 0.040% or less,
S: 0.010% or less,
Cr: 16.0% to 30.0%,
Al: 2.0% to 6.5%,
N: 0.020% or less,
Ni: 0.50% or less,
Ca: 0.0002% to 0.0100%, and
at least one selected from the group consisting of
Zr: 0.01% to 0.20%,
Hf: 0.01% to 0.20%,
REM: 0.01% to 0.20%,
Cu: 0.01% to 0.10%,
V: 0.01% to 0.50%,
Mo: 0.01% to 6.0%,
B: 0.0001% to 0.0050%, and
Mg: 0.0002% to 0.0100%, with the balance being Fe and inevitable impurities, the Fe—Cr alloy satisfying the following formula (1):

$$14.0 \leq \%\ Si + 1.15 \times \%\ Al + 0.35 \times \%\ Cr \qquad (1)$$

where % Si, % Al and % Cr indicate a Si content, an Al content, and a Cr content, by mass %, respectively in the chemical composition.

7. The Fe—Cr alloy according to claim 6 having a sheet thickness of 200 μm or less.

8. A resistance heating element made of the Fe—Cr alloy according to claim 7.

9. A resistance heating element made of the Fe—Cr alloy according to claim 6.

10. The Fe—Cr alloy according to claim 6, wherein the Al content of the chemical composition is 5.3% to 6.5%.

11. A Fe—Cr alloy having a chemical composition consisting of, by mass %,
C: 0.020% or less,
Si: 3.1% to 10.0%,
Mn: 1.0% or less,
P: 0.040% or less,
S: 0.010% or less,
Cr: 16.0% to 30.0%,
Al: 4.0% to 6.5%,
N: 0.020% or less,
Ni: 0.50% or less,
W: 2.3% to 6.0%,
Ca: 0.0002% to 0.0100%, and
at least one selected from the group consisting of
Ti: 0.01% to 0.50%,
Zr: 0.01% to 0.20%,
Hf: 0.01% to 0.20%,
REM: 0.01% to 0.20%,
Cu: 0.01% to 0.10%,
Nb: 0.01% to 0.50%,
V: 0.01% to 0.50%,
Mo: 0.01% to 6.0%,
B: 0.0001% to 0.0050%, and
Mg: 0.0002% to 0.0100%, with the balance being Fe and inevitable impurities, the Fe—Cr alloy satisfying the following formula (1):

$$14.0 \leq \%\ Si + 1.15 \times \%\ Al + 0.35 \times \%\ Cr \qquad (1)$$

where % Si, % Al and % Cr indicate a Si content, an Al content, and a Cr content, by mass %, respectively in the chemical composition.

12. The Fe—Cr alloy according to claim 11 having a sheet thickness of 200 μm or less.

13. A resistance heating element made of the Fe—Cr alloy according to claim 12.

14. A resistance heating element made of the Fe—Cr alloy according to claim 11.

15. The Fe—Cr alloy according to claim 11, wherein the Al content of the chemical composition is 5.3% to 6.5%.

16. A Fe—Cr alloy having a chemical composition consisting of, by mass %,
C: 0.020% or less,
Si: 5.5% to 10.0%,
Mn: 1.0% or less,
P: 0.040% or less,
S: 0.010% or less,
Cr: 16.0% to 30.0%,
Al: 4.0% to 6.5%,
N: 0.020% or less,
Ni: 0.50% or less,
Ca: 0.0002% to 0.0100%, and
at least one selected from the group consisting of
Ti: 0.01% to 0.50%,
Zr: 0.01% to 0.20%,
Hf: 0.01% to 0.20%,
REM: 0.01% to 0.20%,
Cu: 0.01% to 0.10%,
Nb: 0.01% to 0.50%,
V: 0.01% to 0.50%,
Mo: 0.01% to 6.0%,
W: 0.01% to 6.0%,
B: 0.0001% to 0.0050%, and
Mg: 0.0002% to 0.0100%, with the balance being Fe and inevitable impurities, the Fe—Cr alloy satisfying the following formula (1):

$$14.0 \leq \%\ Si + 1.15 \times \%\ Al + 0.35 \times \%\ Cr \qquad (1)$$

where % Si, % Al and % Cr indicate a Si content, an Al content, and a Cr content, by mass %, respectively in the chemical composition.

17. The Fe—Cr alloy according to claim 16 having a sheet thickness of 200 μm or less.

18. A resistance heating element made of the Fe—Cr alloy according to claim 17.

19. A resistance heating element made of the Fe—Cr alloy according to claim 16.

20. The Fe—Cr alloy according to claim 16, wherein the Al content of the chemical composition is 5.3% to 6.5%.

21. A Fe—Cr alloy having a chemical composition consisting of, by mass %,
C: 0.020% or less,
Si: 3.1% to 10.0%,
Mn: 1.0% or less,
P: 0.040% or less,
S: 0.010% or less,
Cr: 16.0% to 30.0%,
Al: 5.5% to 6.5%,
N: 0.020% or less, and Ni: 0.50% or less, with the balance being Fe and inevitable impurities, the Fe—Cr alloy satisfying the following formula (1):

14.0≤% Si+1.15×% Al+0.35×% Cr　　(1)

where % Si, % Al and % Cr indicate a Si content, an Al content, and a Cr content, by mass %, respectively in the chemical composition.

22. A Fe—Cr alloy having a chemical composition consisting of, by mass %,
C: 0.020% or less,
Si: 3.1% to 10.0%,
Mn: 1.0% or less,
P: 0.040% or less,
S: 0.010% or less,
Cr: 16.0% to 30.0%,
Al: 5.5% to 6.5%,
N: 0.020% or less,
Ni: 0.50% or less, and
at least one selected from the group consisting of
Zr: 0.01% to 0.20%,
Hf: 0.01% to 0.20%,
REM: 0.01% to 0.20%,
Cu: 0.01% to 0.10%,
V: 0.01% to 0.50%,
Mo: 0.01% to 6.0%,
B: 0.0001% to 0.0050%,
Ca: 0.0002% to 0.0100%, and
Mg: 0.0002% to 0.0100%, with the balance being Fe and inevitable impurities, the Fe—Cr alloy satisfying the following formula (1):

14.0≤% Si+1.15×% Al+0.35×% Cr　　(1)

where % Si, % Al and % Cr indicate a Si content, an Al content, and a Cr content, by mass %, respectively in the chemical composition.

23. A Fe—Cr alloy having a chemical composition consisting of, by mass %,
C: 0.020% or less,
Si: 3.1% to 10.0%,
Mn: 1.0% or less,
P: 0.040% or less,
S: 0.010% or less,
Cr: 16.0% to 30.0%,
Al: 2.0% to 6.5%,
N: 0.020% or less,
Ni: 0.50% or less, and
Mg: 0.0002% to 0.0100%, with the balance being Fe and inevitable impurities, the Fe—Cr alloy satisfying the following formula (1):

14.0≤% Si+1.15×% Al+0.35×% Cr　　(1)

where % Si, % Al and % Cr indicate a Si content, an Al content, and a Cr content, by mass %, respectively in the chemical composition.

24. The Fe—Cr alloy according to claim 23, wherein the Al content of the chemical composition is 5.3% to 6.5%.

25. A Fe—Cr alloy having a chemical composition consisting of, by mass %,
C: 0.020% or less,
Si: 3.1% to 10.0%,
Mn: 1.0% or less,
P: 0.040% or less,
S: 0.010% or less,
Cr: 16.0% to 30.0%,
Al: 2.0% to 6.5%,
N: 0.020% or less,
Ni: 0.50% or less,
Mg: 0.0002% to 0.0100%, and
at least one selected from the group consisting of
Zr: 0.01% to 0.20%,
Hf: 0.01% to 0.20%,
REM: 0.01% to 0.20%,
Cu: 0.01% to 0.10%,
V: 0.01% to 0.50%,
Mo: 0.01% to 6.0%,
B: 0.0001% to 0.0050%, and
Ca: 0.0002% to 0.0100%, with the balance being Fe and inevitable impurities, the Fe—Cr alloy satisfying the following formula (1):

14.0≤% Si+1.15×% Al+0.35×% Cr　　(1)

where % Si, % Al and % Cr indicate a Si content, an Al content, and a Cr content, by mass %, respectively in the chemical composition.

26. The Fe—Cr alloy according to claim 25, wherein the Al content of the chemical composition is 5.3% to 6.5%.

* * * * *